United States Patent
Park et al.

(10) Patent No.: US 7,271,430 B2
(45) Date of Patent: Sep. 18, 2007

(54) IMAGE SENSORS FOR REDUCING DARK CURRENT AND METHODS OF FABRICATING THE SAME

(75) Inventors: Chan Park, Yongin-si (KR); Jong-cheol Shin, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 11/143,783

(22) Filed: Jun. 3, 2005

(65) Prior Publication Data

US 2005/0280054 A1    Dec. 22, 2005

Related U.S. Application Data

(63) Continuation-in-part of application No. 11/032,147, filed on Jan. 11, 2005, now Pat. No. 7,214,974.

(30) Foreign Application Priority Data

Jun. 4, 2004  (KR) ............... 10-2004-0040900
Nov. 4, 2004  (KR) ............... 10-2004-0089255
Nov. 8, 2004  (KR) ............... 10-2004-0090444

(51) Int. Cl.
*H01L 27/148* (2006.01)

(52) U.S. Cl. ..................... 257/225; 257/292
(58) Field of Classification Search ................ 257/290, 257/225, 239, 292

See application file for complete search history.

(56) References Cited

U.S. PATENT DOCUMENTS

| 5,514,887 | A  | * | 5/1996  | Hokari ................ 257/222 |
| 5,625,210 | A  |   | 4/1997  | Lee et al. |
| 5,904,493 | A  |   | 5/1999  | Lee et al. |
| 6,027,955 | A  |   | 2/2000  | Lee et al. |
| 6,100,551 | A  |   | 8/2000  | Lee et al. |
| 6,677,656 | B2 | * | 1/2004  | François ............... 257/462 |
| 6,730,899 | B1 |   | 5/2004  | Stevens et al. |
| 7,057,219 | B2 | * | 6/2006  | Park et al. ............ 257/292 |
| 2005/0280046 | A1 | | 12/2005 | Shin |

FOREIGN PATENT DOCUMENTS

| JP | 11-274450        | 10/1999 |
| JP | 2004-087963      | 3/2004  |
| KR | 1020020057250 A  | 7/2002  |
| KR | 1020030090871 A  | 12/2003 |

\* cited by examiner

*Primary Examiner*—Mark V. Prenty
(74) *Attorney, Agent, or Firm*—Volentine & Whitt, PLLC

(57) ABSTRACT

An image sensor includes a semiconductor substrate of a first conductivity type, a photodiode of a second conductivity type located in the substrate, a hole accumulated device (HAD) region of the first conductivity type located over the photodiode, a thin surface diffusion region formed on the surface of the HAD region, and a transfer gate located over the surface of the substrate adjacent the HAD region. The image sensor further includes a first channel region of the first conductivity type located in the substrate and aligned below the transfer gate, a second channel region of the second conductivity type located in the substrate between said transfer gate and the first channel region, and an floating diffusion region which is located in the substrate and which electrically contacts the second channel region.

18 Claims, 6 Drawing Sheets

IMAGE SENSORS FOR REDUCING DARK CURRENT AND METHODS OF FABRICATING THE SAME

CROSS-REFERENCE TO RELATED APPLICATIONS

This is a continuation-in-part of, and a claim of priority is made to, non-provisional U.S. patent application Ser. No. 11/032,147, filed Jan. 11, 2005 now U.S. Pat. No. 7,214,974, the contents of which are incorporated herein by reference in its entirety.

A claim of priority is also made to Korean Patent Applications Nos. 2004-40900, 2004-89255, and 2004-90444, filed respectively on Jun. 4, 2004, Nov. 4, 2004, and Nov. 8, 2004, the contents of which are incorporated herein by reference in their entirety.

BACKGROUND OF THE INVENTION

1. Field of the Invention

The present invention relates generally to an image sensor used to transform optical signals into electrical signals. More particularly, the invention relates to a complementary metal oxide semiconductor (CMOS) image sensor and a method of fabricating the same.

2. Description of the Related Art

Complementary metal-oxide semiconductor (CMOS) image sensors (CISs) and charge coupled device (CCD) image sensors are commonly employed in a variety of modern technologies including, for example, cellular phones, personal digital assistants (PDAs), digital cameras. CMOS and CCD image sensors transform light incident on a array of two-dimensional photodiodes into electrical charges, which are subsequently transformed into electrical voltages after a predetermined exposure period. One major difference between CMOS image sensors and a CCD image sensors, however, is the manner in which the electrical charges corresponding to each photodiode are transformed into electrical voltages. In a CCD image sensor, the electrical charges are sequentially transferred to a common output structure where they are transformed into electrical voltages. In a CMOS image sensor, on the other hand, each photodiode has its own individual output structure for transforming the electrical charges into electrical voltages.

A number of problems may occur in conventional CMOS image sensors due to the presence of dark current or other forms of noise. For example, dark current is known to deteriorate charge transmission efficiency and charge storage capacity, which can lead to image defects such as pixel saturation. The phrase "dark current" refers to electrical charges that are accumulated at a photodiode in the absence of incident light. It is reported that dark current is usually caused by silicon dangling bonds existing on the surface of a silicon substrate. At relatively high thermal ranges, these dangling silicon bonds generate negative charges that can be accumulated by the photodiode even in the absence of incident light. Thus, if several silicon dangling bonds exist on the surface of the silicon substrate, the image sensor may behave as if light were present, even if the image sensor is in a dark place.

Several technologies have been proposed to reduce dark current in image sensors (see U.S. Pat. No. 6,730,899, No. 6,714,241, and No. 6,649,950). However, these methods are limited to reducing dark current only within specific portions of a unit pixel.

For example, in a photodiode of a typical CMOS image sensor, various interface defects may exist near a semiconductor substrate surface in a P+-type hole accumulated device (HAD) region formed on an N-type photodiode. Such defects result from fabrication processes performed on the semiconductor substrate, silicon dangling bonds, or the like. Charges generated by the interface defects are introduced into an N-type photodiode through various passages, and travel to a floating diffusion region through a transfer gate region along with electrons generated by incident light on the photodiode. As a result, these charges show up as outputs from a source follower buffer amplifier. The output voltage resulting from the defects is added to the output voltage caused by incident light, thereby causing image defects such as white spots on images.

Because of the problems caused by dark current, there is a general demand in the industry for image sensors that exhibit reduced dark current, such as the dark current caused by dangling silicon bonds on a semiconductor substrate surface.

SUMMARY OF THE INVENTION

According to one embodiment of the present invention, an image sensor is provided which includes a photodiode of a first conductivity type located in a semiconductor substrate, a hole accumulated device (HAD) region of a second conductivity type located at a surface of the semiconductor substrate and over the photodiode, a surface diffusion region of the first conductivity type formed on the HAD region, a transfer gate located over the surface of the substrate adjacent the HAD region, a first channel region of the second conductivity type located in the substrate and aligned below the transfer gate, a second channel region of the first conductivity type located in the semiconductor substrate between the transfer gate and the first channel region, and a floating diffusion region of the first conductivity type located in the semiconductor substrate and an in electrical contact with the second channel region.

According to another embodiment of the present invention an image sensor is provided which includes an N-type photodiode formed in a semiconductor substrate, a P+-type hole accumulated device (HAD) region formed at the surface of the semiconductor substrate on the photodiode, an N--type surface diffusion region formed at the surface of the substrate on the HAD region, a transfer gate formed near the photodiode, a P--type channel region formed under the transfer gate, an N+-type floating diffusion region separated from the photodiode by the P--type channel region, and an N--type channel region formed at the surface of the semiconductor substrate on the P--type channel region, the N--type channel region being separated from the photodiode, and connected to the N--type surface diffusion region and the floating diffusion region.

According to still another embodiment of the present invention, an image sensor is provided which includes an active pixel array and a CMOS control circuit connected to the active pixel array, wherein the active pixel array comprises a matrix of pixels. Each of the pixels in the matrix comprises an N-type photodiode located in a semiconductor substrate, a P+-type hole accumulated device (HAD) region located at a surface of the semiconductor substrate and over the photodiode, an N--type surface diffusion region formed in the surface of the semiconductor substrate on the HAD region, a transfer gate located over the surface of the semiconductor substrate adjacent the HAD region, a P--type channel region located in the semiconductor substrate and aligned below the transfer gate, an N--type channel region located in the semiconductor substrate between the transfer gate and the first channel region, and an N+-type floating diffusion region which is located in the semiconductor substrate and which electrically contacts the channel region.

According to yet another embodiment of the present invention, a method of fabricating an image sensor is provided. The method comprises implanting impurities of a first conductivity type in a semiconductor substrate to define a first channel region extending to a first depth from a surface of the semiconductor substrate, and implanting impurities of a second conductivity type in the substrate surface to define a second channel region. The second channel region is located over the first channel region and extends to a second depth from the substrate surface. In addition, the first depth is greater than the second depth. The method further comprises forming a transfer gate electrode over surface of the semiconductor substrate and over the first and second channel regions and implanting impurities of the first conductivity type in the semiconductor substrate to define a hole accumulated device (HAD) region which extends to a third depth from the substrate surface and which is adjacent the gate electrode. The method still further comprises implanting impurities of the second conductivity type in the semiconductor substrate to define a photodiode which is buried in the substrate and extends to a fourth depth from substrate surface, wherein the fourth depth is greater than the third depth, implanting impurities of the second conductivity type in the semiconductor substrate to define a surface diffusion region which is on the HAD region and is connected to the second channel region, and implanting impurities of the second conductivity type in the substrate to define a floating diffusion region which electrically contacts the second channel region. The HAD region is located over the photodiode.

According to yet another embodiment of the present invention, a method of fabricating an image sensor is provided, the method including forming a P--type first channel region in a semiconductor substrate near an interface between a photodiode region and a transistor region of the semiconductor substrate, forming an N--type second channel region at the surface of the semiconductor substrate on the first channel region, forming a first gate insulating layer and a transfer gate on the second channel region, forming a P+-type HAD region at the surface of the semiconductor substrate in the photodiode region, forming an N-type photodiode near the first channel region and separated from the second channel region in the photodiode region, forming an N--type surface diffusion region at the surface of the semiconductor substrate on the HAD region, the surface diffusion region being connected to the second channel region, and forming an N+-type floating diffusion region connected with the second channel region in the transistor region.

According to still another embodiment of the present invention, a method of fabricating an image sensor including a plurality of active pixels, each pixel having a transistor region including at least a floating diffusion region, a transfer transistor, and a source follower buffer amplifier; and a photodiode region is provided. The method comprises forming a P+-type HAD region in the photodiode region, forming an N-type photodiode under the HAD region in the photodiode region, and forming an N--type surface diffusion region in the surface of the semiconductor substrate on the HAD region.

BRIEF DESCRIPTION OF THE DRAWINGS

The invention is described below in relation to several embodiments illustrated in the accompanying drawings. Throughout the drawings like reference numbers indicate like exemplary elements, components, or steps. In the drawings:

FIG. 4C is a graphical view for explaining the accumulation of charges at the surface of a semiconductor substrate and a channel region of the CIS device shown in FIG. 3, wherein the CIS device does not include a surface diffusion region; and, FIGS. 5A through 5H are schematic cross-sectional views for explaining a method of manufacturing a CMOS image sensor according to an embodiment of the present invention.

DETAILED DESCRIPTION OF PREFERRED EMBODIMENTS

Exemplary embodiments of the invention are described below with reference to the corresponding drawings. These embodiments are presented as teaching examples. The actual scope of the invention is defined by the claims that follow.

Figure 1:
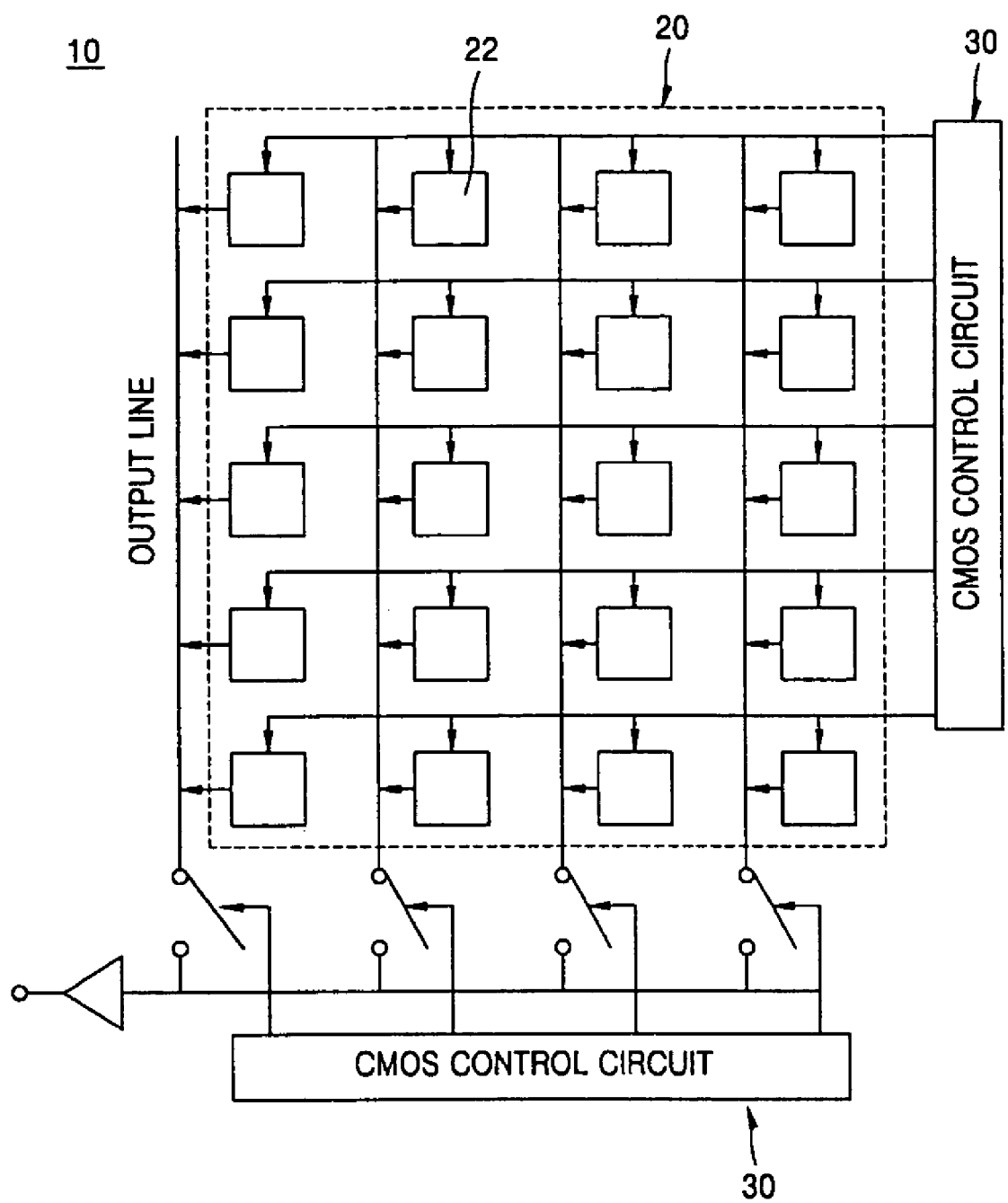
FIG. 1 is a schematic block diagram of a CMOS image sensor (CIS) device according an embodiment of the present invention.

FIG. 1 illustrates an example in which an embodiment of the present invention is configured as a CMOS image sensor (CIS) 10. CIS 10 generally includes an active pixel array 20 and CMOS control circuitry 30. As is schematically shown in FIG. 1, pixel array 20 includes a plurality of active pixels 22 generally arranged in matrix form. Word lines are respectively connected to pixels 22 of each row of pixel array 20, and bit lines are respectively connected to pixels 22 of each column of pixel array 20. CMOS control circuitry 30 includes a row decoder for selecting rows (word lines) of pixel array 20, and a column decoder for selecting columns (bit lines) of pixel array 20. Selected bit lines are connected to an output amplifier via switching elements controlled by CMOS circuitry 30.

Figure 2:
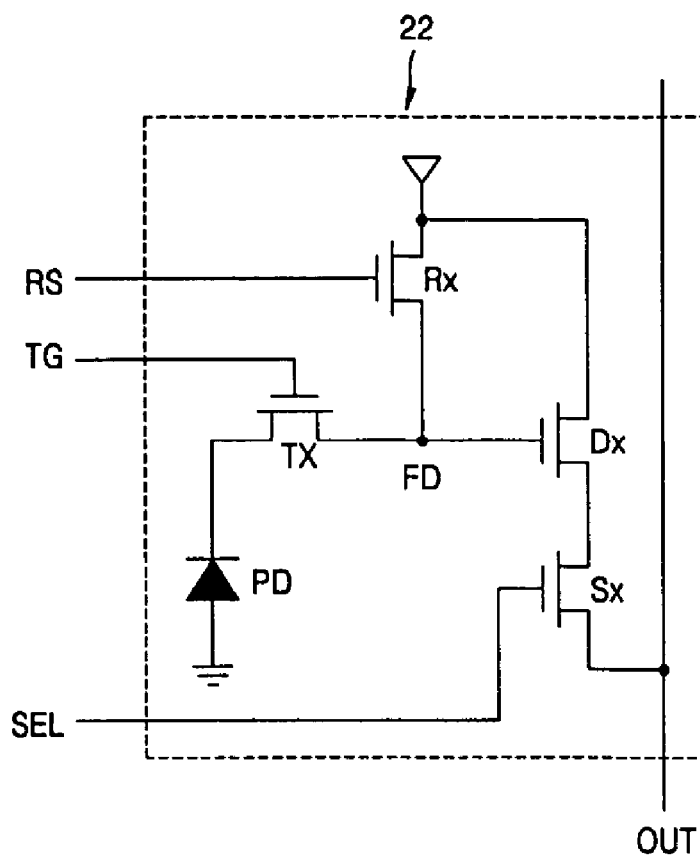
FIG. 2 is an equivalent circuit diagram of a photo-detector element of the CIS device in FIG. 1.

An equivalent circuit diagram of an example of an active pixel 22 is shown in FIG. 2. A photodiode PD of active pixel 22 captures incident light and converts the captured light into an electric charge. The electric charge is selectively transferred from photodiode PD to a floating diffusion region FD via a transfer transistor Tx. Transfer transistor Tx is controlled by a transfer gate TG signal. The floating diffusion region FD is connected to the gate of a driver transistor Dx which functions as a source follower (amplifier) for buffering an output voltage. The output voltage is selectively transferred to an output line OUT by a select transistor Sx. Select transistor Sx is controlled by a select signal SEL. A reset transistor Rx is controlled by a reset signal RS and resets charges accumulated in the floating diffusion region FD to a reference level.

Figure 3:
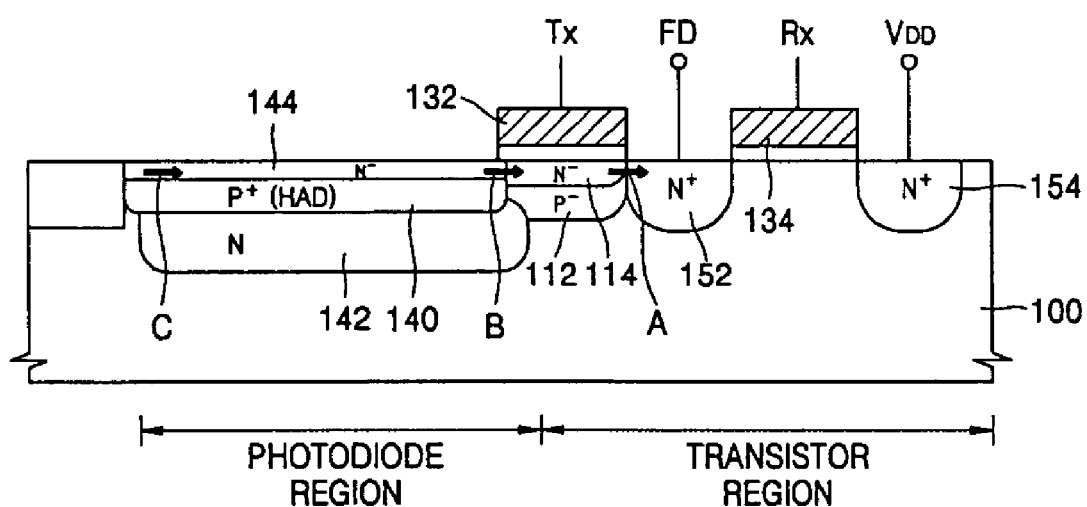
FIG. 3 is a schematic cross-sectional view of a portion of the photo-detector element of FIG. 2.

FIG. 3 is a cross-sectional schematic view of an embodiment of the photodiode PD, transfer transistor Tx and reset transistor Rx illustrated in FIG. 2. For purposes of explanation, photodiode PD corresponds to a photodiode region of a P type semiconductor substrate 100, reset transistor Rx is contained in a transistor region of P type semiconductor substrate 100, and transfer transistor Tx is connected therebetween.

Referring to FIG. 3, the photodiode region comprises an N type photodiode 142 located in the surface of the photodiode region of semiconductor substrate 100. Negative charges accumulate in photodiode 142 when light is incident on the surface of semiconductor substrate 100.

To reduce the presence of dangling silicon bonds on the surface of semiconductor substrate 100, a P+ type hole accumulated device (HAD) region 140 is interposed between the surface of semiconductor substrate 100 and photodiode 142. HAD region 140 causes a recombination of negative charges at the surface of semiconductor substrate 100 located over photodiode 142, thus avoiding the accumulation of such charges in photodiode 142.

An N− type surface diffusion region 144 is formed to a small depth on the surface of semiconductor substrate 100 and on HAD region 140.

The transistor region of semiconductor substrate 100 includes an N+ type floating diffusion region 152, an N+ type drain region 154, and a gate 134 extending there between. In this example, gate 134 receives reset signal RS, drain region 154 is connected to a power supply providing a voltage VDD, and floating diffusion region 152 is connected to floating node FD illustrated in FIG. 2. Drain region 154, floating diffusion region 152, and gate 134 define reset transistor Rx of FIG. 2.

Still referring to FIG. 3, a transfer gate 132 is located over the surface of semiconductor substrate 100 between HAD region 140 and floating diffusion region 152. Further, a first P− type channel region 112 is located in semiconductor substrate 100 and aligned below transfer gate 132, and a second N− type channel region 114 is located in semiconductor substrate 100 between transfer gate 132 and first channel region 112. Floating diffusion region 152 electrically contacts second channel region 114 as depicted by the arrow A of FIG. 3.

In the example of this embodiment, floating diffusion region 152 has an impurity concentration which is greater than the impurity concentration of second channel region 114, first channel region 112 has an impurity concentration which is greater than an impurity concentration of semiconductor substrate 100, and HAD region 140 has an impurity concentration which is greater than the impurity concentration of semiconductor substrate 100. Also, in this example, first channel region 112 contacts both HAD region 140 and photodiode 142, thereby isolating second channel region 114 from photodiode 142 by HAD region 140.

Further, in the example of this embodiment, an implantation depth of second channel region 114 is less than an implantation depth of floating diffusion region 152 and less than an implantation depth of HAD region 140. Also, in this example, an implantation depth of first channel region 112 is less than an implantation depth of photodiode 142 and less than the implantation depth of floating diffusion region 152 while an implantation depth of surface diffusion region 144 is less than or equal to the implantation depth of second channel region 114. Surface diffusion region 144 is connected to second channel region 114, but is completely isolated from other active pixels.

Still further, in the example of this embodiment, transfer gate 132 partially overlaps photodiode 142 and HAD region 140, where the degree of overlap of HAD region 140 is less than the degree of overlap of photodiode 142.

The operation of the CIS device described above will be explained as follows. Photodiode 142 generates free electrons, or "charges" in proportion to an amount of incident light received thereon. The charges are transferred to floating diffusion region 152 whenever transfer transistor Tx is turned on and reset transistor Rx is turned off. Otherwise, the charges are stored in photodiode 142. Where transfer transistor Tx is turned off, a depletion region is formed in photodiode 142.

Reset transistor Rx turns on in response to reset signal RS on reset gate 134. Where reset transistor Rx is turned on, floating diffusion region 152 is charged to voltage VDD across reset gate 134 and floating diffusion region 152 is reset to a state adapted for receiving charges from photodiode 142. Where reset transistor Rx is turned off, floating diffusion region 152 returns to a previous state, the voltage level of output line OUT drops by a predetermined amount using feed-through, coupling or the like, and floating diffusion region 152 assumes a feed-through voltage level slightly lower than voltage VDD. The resulting voltage level of floating diffusion region 152 is detected as a first sampling voltage.

Transfer gate Tx turns on in response to transfer gate signal TG. Where transfer gate Tx is turned on, charges generated by photodiode 142 migrate to floating diffusion region 152 through the channel region under transfer gate 132. Thus, floating diffusion region 152 is populated with charges, and the voltage level of output line OUT is reduced. The resulting voltage level of floating diffusion region 152 is detected as a second sampling voltage. The output signal of the CIS is defined as the difference between the first sampling voltage and the second sampling voltage.

In the CIS shown in FIG. 3, first channel region 112 is formed by implanting P-type ion impurities so that it acts as a potential barrier between photodiode 142 and floating diffusion region 152. First channel region 112 is formed with a low density of impurities to facilitate ready transfer of signal electrons from photodiode 142 to floating diffusion region 152 when a transfer gate signal TG is applied to the transfer gate 132. As second channel region 114 formed in the surface of semiconductor substrate 100 under the transfer gate 132 is formed to be connected with floating diffusion region 152, the potential under transfer gate 132 is increased toward floating diffusion region 152. As a result, thermally generated electrons in the surface of semiconductor substrate 100 under transfer gate 132 generally drift toward floating diffusion region 152. Further, as surface diffusion region 144 is formed to be connected with second channel region 114, the potential on the surface of semiconductor substrate 100 in the photodiode region increases toward transfer gate 132. As a result, charges generated by the interface defects located relatively far away from transfer transistor Tx may drift through second channel region 114 toward floating diffusion region 152.

As previously mentioned, where reset transistor Rx is turned on, floating diffusion region 152 assumes voltage VDD. Thus, electrons at second channel region 114 are transferred to floating diffusion region 152 during the reset operation according to the potential of floating diffusion region 152, thereby causing second channel region 114 to assume a full depletion state. Then, electrons generated by interface defects near the surface of semiconductor substrate 100 in photodiode 142, and thermally generated electrons from the surface of semiconductor substrate 100 under transfer gate 132 are all moved out from surface diffusion region 144 and second channel region 114 to floating diffusion region 152 by the potential of floating diffusion region 152 as designated by arrows A, B, and C. As first channel region 112 is formed under the second channel region 114, there exists a potential barrier in photodiode 142 by first channel region 112. The electrons of surface diffusion region 144 and the second channel region 114 cannot be diffused into photodiode 142. Electrons that have been transferred to floating diffusion region 152 migrate to drain region 154 in the case where reset transistor Rx is in on, and are not output in the source follower buffer amplifier. As a result, image defects caused by noise or dark currents resulting from electrons generated by the interface defects between photodiode 142 and the surface of semiconductor substrate 100 under transfer gate 132 are effectively eliminated.

Figure 4A:
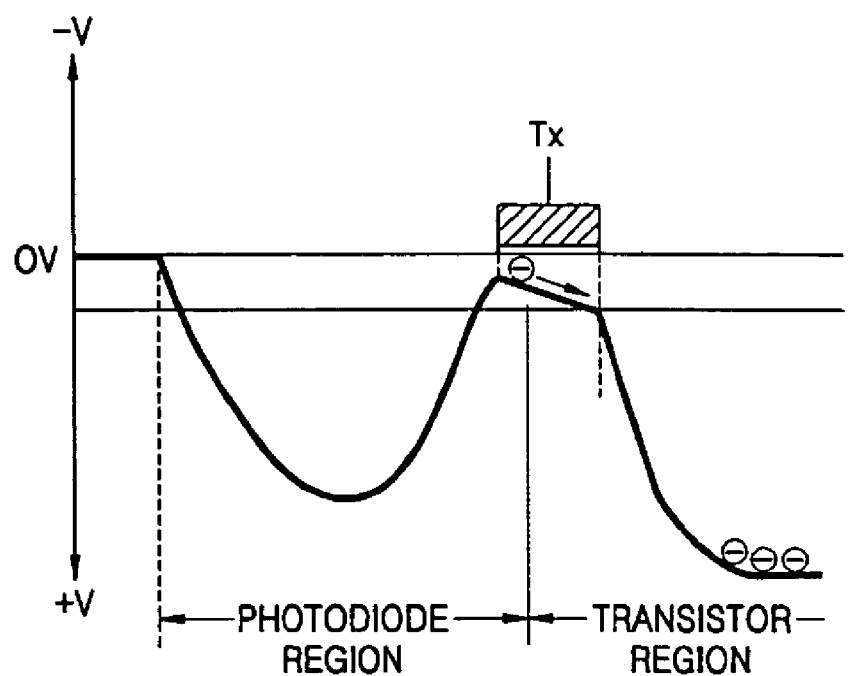
FIG. 4A is a graphical view for explaining the accumulation of charges in a photodiode and a channel region of a CIS device.
Figure 4B:
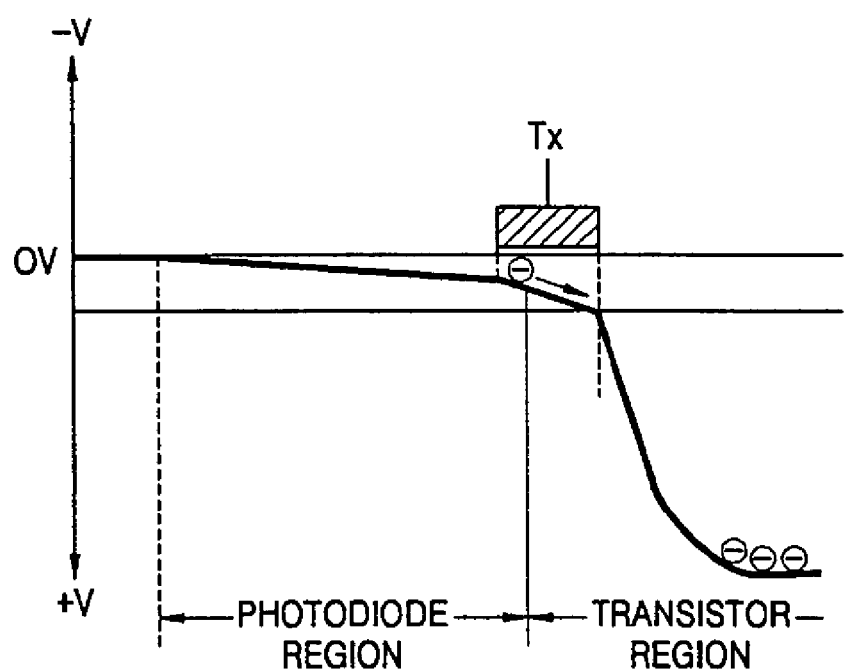
FIG. 4B is a graphical view for explaining the accumulation of charges at the surface of a semiconductor substrate and a channel region of a CIS device.

FIGS. 4A and 4B are potential distribution diagrams for different portions of the CIS device of FIG. 3. In particular, FIG. 4A shows a potential distribution for photodiode 142 and first and second channel regions 112 and 114. FIG. 4B shows a potential distribution for the surface of semiconductor substrate 100 and first and second channel regions 112 and 114. FIG. 4C is a potential distribution diagram for a CIS device like that of FIG. 3 but without surface diffusion region 144. More particularly, FIG. 4C shows a potential distribution for the surface of semiconductor substrate 100 and first and second channel regions 112 and 114.

Referring to FIG. 4A, the potential distribution continuously increases beneath the gate electrode in a direction towards the floating diffusion region. As such, electrons which form at the substrate surface (for example, from silicon dangling bonds) beneath the gate electrode will drift to the floating diffusion region, and not to photodiode 142. Charges are therefore not accumulated in the photodiode 142, thus reducing dark current.

Referring to FIG. 4B, where surface diffusion region 144 is present, the potential distribution at the surface of semiconductor substrate 100 in the PD region increases in the direction of the transfer gate. As a result, charges generated by interface defects on the surface of semiconductor substrate 100 are moved to floating diffusion region 152 through second channel region 114. Where reset transistor Rx is on, the charges migrate toward the power supply, and are not output in the source follower buffer amplifier.

Referring to FIG. 4C, where surface diffusion region 144 is not present, the potential distribution at the surface of semiconductor substrate 100 is nearly constant throughout the PD region. As a result, charges generated by the interface defects at the surface of the photodiode region are readily moved to photodiode 142, thereby resulting in image defects such as noise or dark current.

An exemplary method of manufacturing the CIS device illustrated in FIG. 3 will now be described with reference to FIGS. 5A through 5H.

Figure 5A:
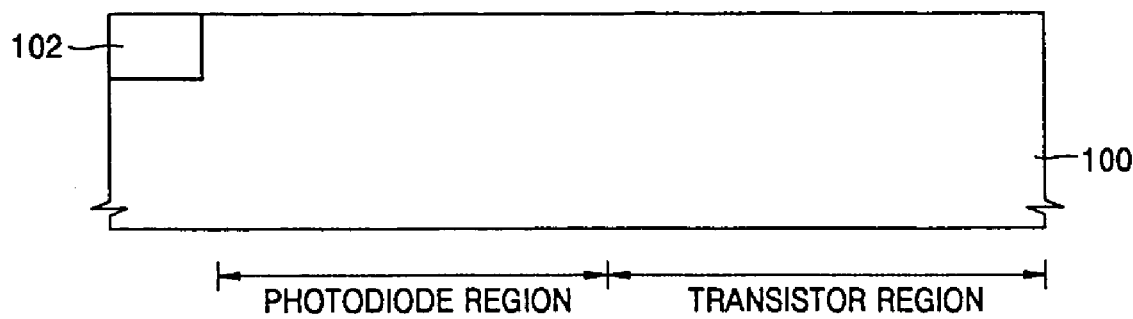

Initially, as shown in FIG. 5A, an isolation layer 102 is formed in semiconductor substrate 100 to define an active area of the semiconductor substrate. Isolation layer 102 is typically formed using a trench isolation method or a local oxidation of silicon (LOCOS) method. A P well (not shown) is formed in a transistor region to form a negative metal oxide semiconductor (NMOS) transistor.

Figure 5B:
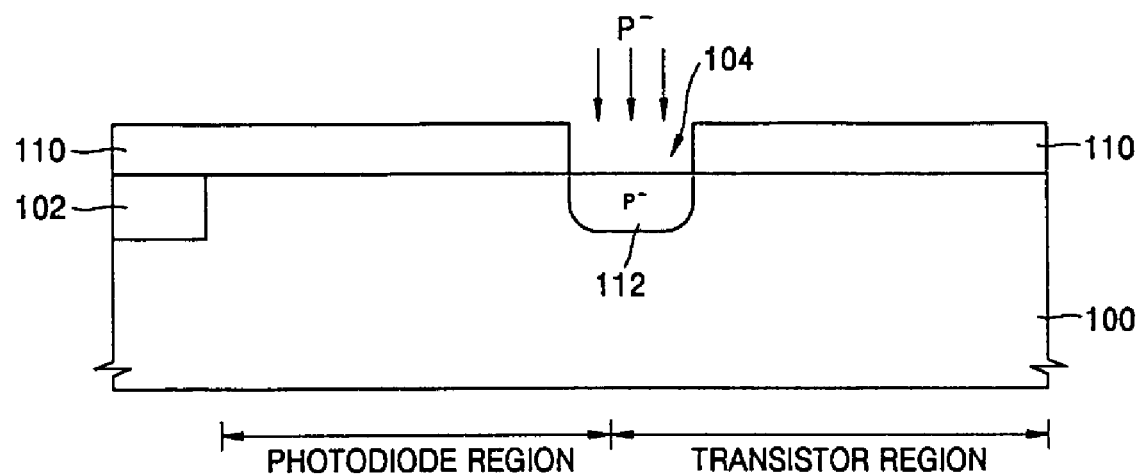

Then, as shown in FIG. 5B, a mask layer 110 is patterned over the surface of substrate 1100 with an opening which defines a transistor region 104. P type impurities are then implanted through the opening to define a P– type channel region 112. In this example, boron is implanted at 30 KeV to obtain an impurity concentration of about $1*10^{12}/cm^2$.

Figure 5C:
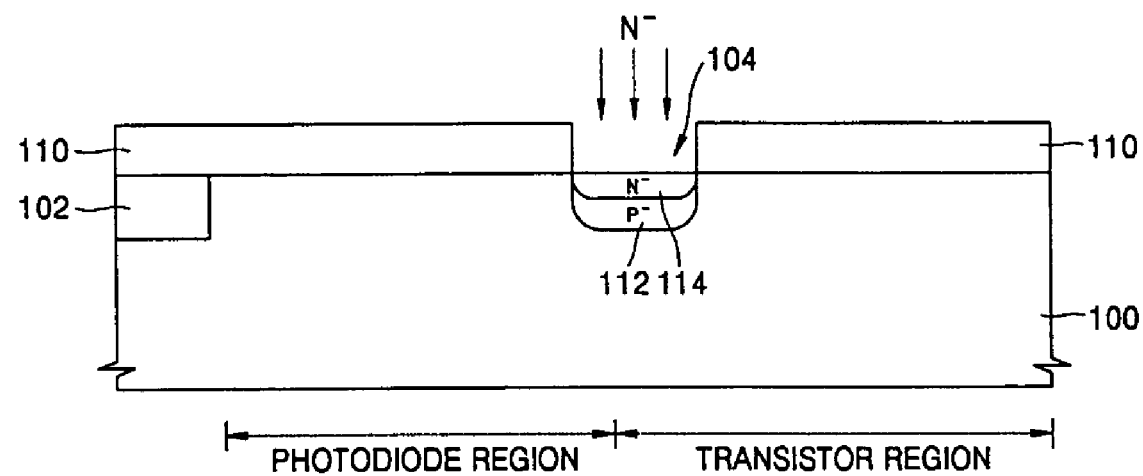

As illustrated in FIG. 5C, an N– type channel region 114 is then formed by implantation of N type impurities through the opening in mask layer 110. In this example, arsenic is implanted at 30 KeV to obtain an impurity concentration of about $5*10^{11}/cm^2$. As shown, the resultant is two channel regions 112 and 114, where the N-type channel region 114 is located between the P– type channel region 112 and the opening in mask layer 110.

Figure 5D:
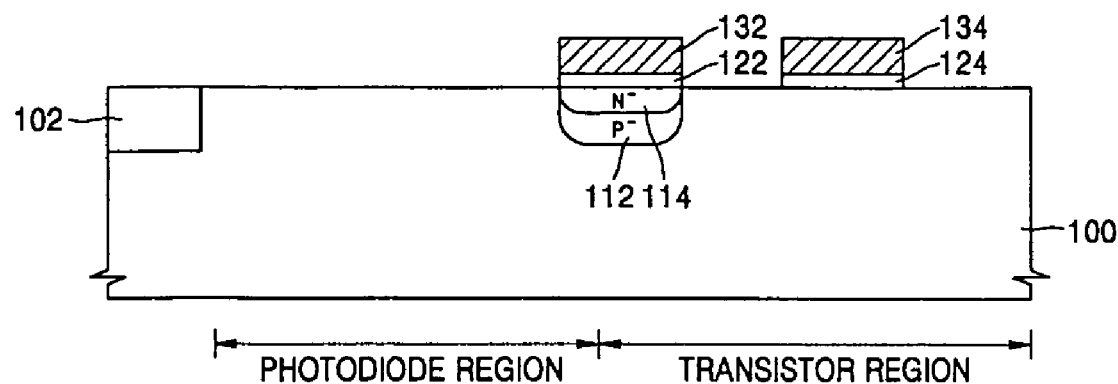

Referring to FIG. 5D, an insulating layer and conductive layer are deposited and patterned to define gate structures over the active region of substrate 100. In particular, a first gate structure is aligned over channel regions 112 and 114, and is defined by a gate insulating layer 122 and a gate electrode 132. A second gate structure is spaced from the first gate structure, and is defined by a gate insulating layer 124 and a gate electrode 134. Although not illustrated in this example, additional gate electrodes may be formed on semiconductor substrate 100 in accordance with different types of CIS to be realized. For example, in the case of fabricating an image sensor having a unit pixel (see, for example, FIG. 2), consisting of one photodiode PD and four MOS transistors Tx, Rx, Dx, and Sx, gate electrodes are formed for the four MOS transistors.

Figure 5E:
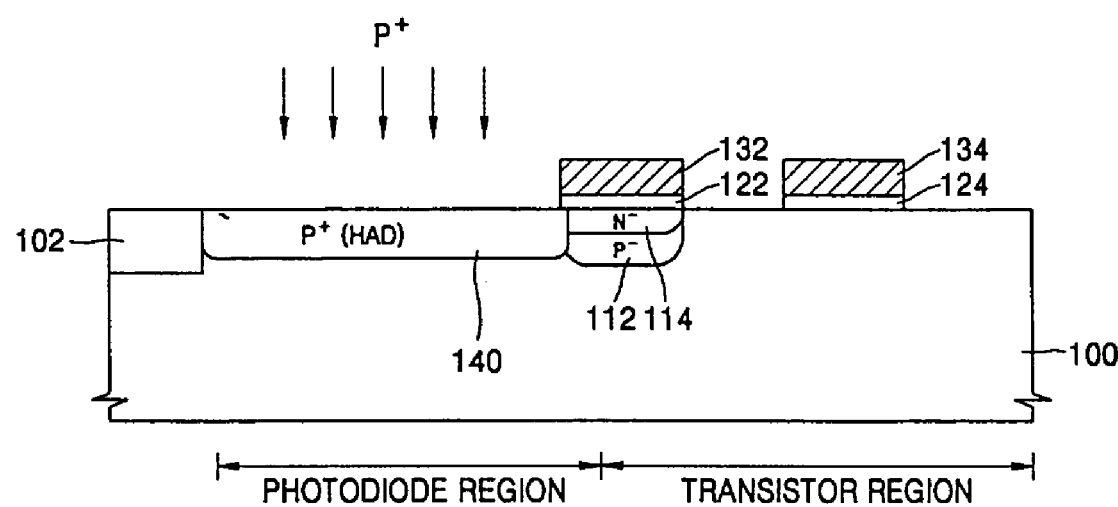

Next, as illustrated in FIG. 5E, a P+ type HAD region 140 is formed by implanting P type ions through an opening in a mask (not shown), where the opening is aligned over a photodiode region of the device. In this example, $BF_2$ is implanted at 50 KeV to obtain an impurity concentration of about $5*10^{13}/cm^2$.

Figure 5F:
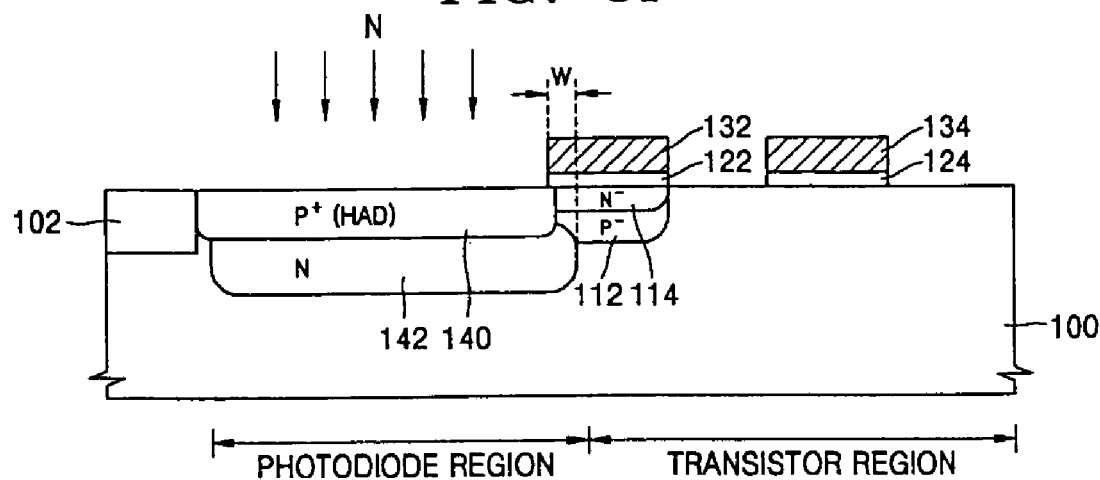

The N type photodiode region 142 is then formed, as shown in FIG. 5F, by implantation of N type impurities through an opening in a mask layer. In this example, arsenic is implanted at 400 KeV to obtain an impurity concentration of about $1.7*10^{12}/cm^2$. Here, the mask layer may optionally be the same as that used to form HAD region 140. Also, as shown by reference character W of FIG. 5F, gate electrode 132 may optionally overlap photodiode region 142.

Figure 5G:
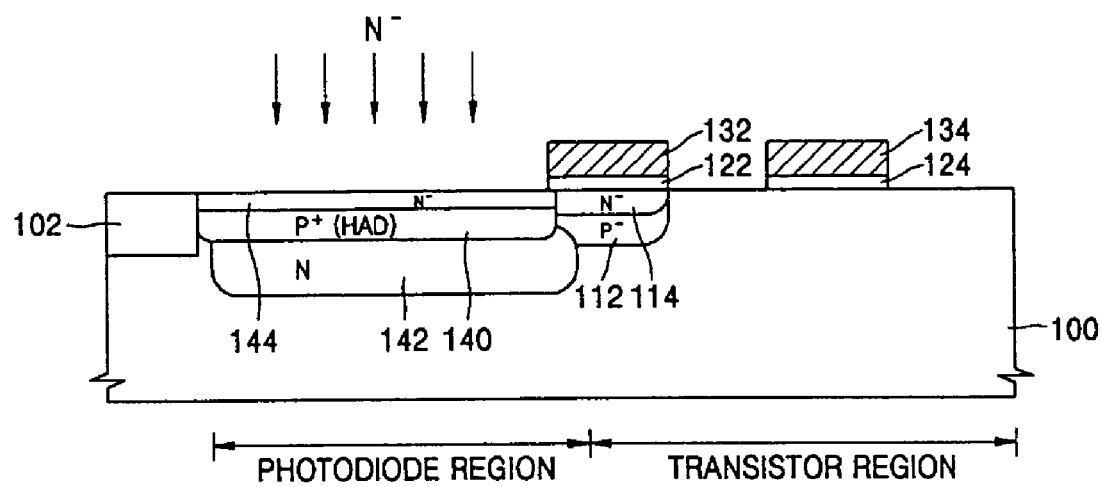

Referring to FIG. 5G, an N–-type surface diffusion region 144 is formed near the surface of the semiconductor substrate 100 by implanting N–-type ions through an opening in a mask (not shown), where the opening is aligned over the photodiode region of the device. The same mask used to form HAD region 140 and photodiode region 142 can be used to form surface diffusion region 144, although it is typically beneficial to use different masks for the different respective ion implantation processes. In this example, arsenic is implanted at 20 keV to obtain an impurity concentration of about $3*10^{11}/cm^2$. Surface diffusion region 144 is formed to be connected with second channel region 114 but isolated from other adjacent pixels by device isolation layer 102.

Figure 5H:
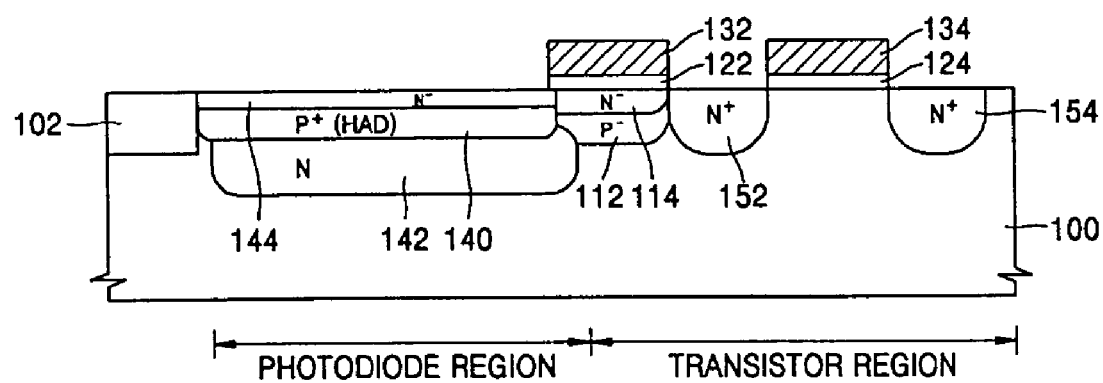

Referring to FIG. 5H, the N+ type floating diffusion region 152 and the N+ type drain region 154 are then formed by implantation of N type impurities. In this example, arsenic (As) is implanted at 40 keV to obtain an impurity concentration of about $3*10^{15}/cm^2$.

As a result of forming floating diffusion region 152, second channel region 114 and floating diffusion region 152 are connected to each other.

Finally, conventional interconnection line formation processes are performed to fabricate the CIS.

In each of the embodiments described above, the CMOS image sensor provides an N–-type surface diffusion region formed on a HAD region in a photodiode region of a unit pixel. The N–-type surface diffusion region is connected with an N--type channel region of a transfer transistor. Charges generated by interface defects on the surface of the semiconductor substrate of the photodiode region migrate across the transfer gate region to a region connected to a power supply due to a potential difference across the transfer gate region and the reset gate region. As a result, the charges are not output to the source follower buffer amplifier, thus preventing image defects from occurring. Therefore, the present invention essentially eliminates the occurrence of white spots in images due to interference effects.

The image sensors of the present invention can be employed in various fields, such as a digital cameras, portable phones, endoscopic equipment, telescopes for artificial satellites, etc.

While the present invention has been particularly shown and described with reference to exemplary embodiments, those of ordinary skill in the art will understand that various changes in form and details may be made thereto without departing from the scope of invention as defined by the following claims.

What is claimed is:

1. An image sensor, comprising:
   a photodiode of a first conductivity type located in a semiconductor substrate;
   a hole accumulated device (HAD) region of a second conductivity type located over the photodiode;
   a surface diffusion region of the first conductivity type located over the HAD region;
   a transfer gate located over the surface of the substrate adjacent the surface diffusion region;
   a first channel region of the second conductivity type located in the substrate and aligned below the transfer gate;
   a second channel region of the first conductivity type located in the semiconductor substrate between the transfer gate and the first channel region; and,
   a floating diffusion region of the first conductivity type located in the semiconductor substrate and in electrical contact with the second channel region.

2. The image sensor of claim 1, wherein the first conductivity type is N-type and the second conductivity type is P-type.

3. The image sensor of claim 1, wherein an impurity concentration of the floating diffusion region is greater than an impurity concentration of the second channel region.

4. The image sensor of claim 1, wherein an implantation depth of the second channel region is less than an implantation depth of the HAD region and less than an implantation depth of the floating diffusion region.

5. The image sensor of claim 1, wherein an implantation depth of the surface diffusion region is less than or equal to an implantation depth of the second channel region.

6. The image sensor of claim 1, wherein an impurity concentration of the first channel region is less than an impurity concentration of the HAD region.

7. The CMOS image sensor of claim 1, wherein an implantation depth of the first channel region is less than an implantation depth of the photodiode.

8. An image sensor, comprising:
   an N-type photodiode formed in a semiconductor substrate;
   a $P^+$-type hole accumulated device (HAD) region formed at the surface of the semiconductor substrate on the photodiode;
   an $N^-$-type surface diffusion region formed at the surface of the substrate over the HAD region;
   a transfer gate formed adjacent the photodiode;
   a $P^-$-type channel region formed under the transfer gate;
   an $N^+$-type floating diffusion region separated from the photodiode by the $P^-$-type channel region; and,
   an $N^-$-type channel region formed at the surface of the semiconductor substrate on the $P^-$-type channel region, the $N^-$-type channel region being separated from the photodiode, and connected to the $N^-$-type surface diffusion region and the floating diffusion region.

9. The image sensor of claim 8, wherein an implantation depth of the $N^-$-type channel region is less than an implantation depth of the HAD region and less than an implantation depth of the floating diffusion region.

10. The image sensor of claim 8, wherein an implantation depth of the surface diffusion region is less than or equal to an implantation depth of the $N^-$-type channel region.

11. The image sensor of claim 9, wherein an implantation depth of the $P^-$-type channel region is less than an implantation depth than the photodiode.

12. An image sensor comprising an active pixel array and a CMOS control circuit connected to the active pixel array, wherein the active pixel array comprises a matrix of pixels, wherein each of the pixels comprises:
    an N-type photodiode located in a semiconductor substrate;
    a $P^+$-type hole accumulated device (HAD) region located at a surface of the semiconductor substrate and over the photodiode;
    an $N^-$-type surface diffusion region formed in the surface of the semiconductor substrate and over the HAD region;
    a transfer gate located over the surface of the semiconductor substrate adjacent the HAD region;
    a $P^-$-type channel region located in the semiconductor substrate and aligned below the transfer gate;
    an $N^-$-type channel region located in the semiconductor substrate between the transfer gate and the first channel region; and,
    an $N^+$-type floating diffusion region which is located in the semiconductor substrate and which electrically contacts the channel region.

13. The image sensor of claim 12, wherein the second channel region and the photodiode electrically separated from each other by at least one of the HAD region and the first channel region.

14. The image sensor of claim 12, wherein an implantation depth of the surface diffusion region is less than or equal to an implantation depth of the second channel region.

15. The image sensor of claim 12, wherein an impurity concentration of the floating diffusion region is greater than an impurity concentration of the surface diffusion region and greater than an impurity concentration of the second channel region.

16. The image sensor of claim 12, wherein an implantation depth of the second channel region is less than an implantation depth of the HAD region and less than an implantation depth of the floating diffusion region.

17. The image sensor of claim 12, wherein an impurity concentration of the first channel region is less than an impurity concentration of the HAD region.

18. The image sensor of claim 12, wherein an implantation depth of the first channel region is less than an implantation depth of the photodiode.

* * * * *